(12) United States Patent
Kim et al.

(10) Patent No.: US 6,377,488 B1
(45) Date of Patent: Apr. 23, 2002

(54) FAST-ERASE MEMORY DEVICES AND METHOD FOR REDUCING ERASING TIME IN A MEMORY DEVICE

(75) Inventors: Yong Kim, Santa Clara; Kendra Nguyen, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/645,623

(22) Filed: Aug. 24, 2000

Related U.S. Application Data
(60) Provisional application No. 60/207,381, filed on May 26, 2000.

(51) Int. Cl.⁷ ............................................. G11C 16/06
(52) U.S. Cl. ........................... 365/185.22; 365/185.29; 365/218
(58) Field of Search ....................... 365/185.22, 185.29, 365/218

(56) References Cited

U.S. PATENT DOCUMENTS

| | | | |
|---|---|---|---|
| 5,740,104 A | 4/1998 | Forbes | 365/185.33 |
| 5,754,477 A | 5/1998 | Forbes | 365/185.03 |
| 5,909,395 A * | 6/1999 | Nobukata | 365/185.22 |
| 6,038,175 A * | 3/2000 | Ra | 365/185.29 |
| 6,055,188 A * | 4/2000 | Takeuchi et al. | 365/185.22 |
| 6,195,290 B1 * | 2/2001 | Dallabora et al. | 365/185.22 |

OTHER PUBLICATIONS

Dipert, B. et al., "Flash Memory Goes Mainstream", IEEE Spectrum, vol. 30, 48–52 (Oct., 1993).

Eldridge, J. "Filing in a Flash", IEEE Spectrum, vol. 30, 53–54 (Oct., 1993).

\* cited by examiner

Primary Examiner—Son T. Dinh

(57) ABSTRACT

A non-volatile semiconductor memory device comprising a memory array, the memory array divided into a plurality of sectors, each sector comprising a plurality of memory cells, which can be electrically erased, and an erase-verify circuit, capable of simultaneously erasing multiple memory sectors. The erase-verify circuit simultaneously erases a plurality memory sectors, and verifies that the memory cells in a selected memory sector of the plurality of memory sectors is erased. When it determines that the selected memory sector is not erased, it again erases the plurality of memory sectors and again verifies whether the selected memory sector is erased. The erasing of the plurality of memory sectors is repeated until it is verified that the memory cells in the selected memory sector is erased.

37 Claims, 8 Drawing Sheets

FAST-ERASE MEMORY DEVICES AND METHOD FOR REDUCING ERASING TIME IN A MEMORY DEVICE

This Appln. claims benefit of Prov. No. 60/207/381 filed May 26, 2000.

BACKGROUND OF THE INVENTION

1. Field of the Invention

The present invention relates generally to the field of electronic data storage devices. More particularly, the present invention relates to non-volatile semiconductor memory devices and reducing the time required to erase data in non-volatile semiconductor memory devices.

2. Description of the Related Art

Many electronic devices, such as computers, personal digital assistants, cellular telephones, digital cameras and similar systems and devices include processors and memory. The memory is used to store computer programs to be executed by the device and/or data operated on by the processors to achieve the functionality of the device. Many devices and systems require that this information be retained in permanent storage/non-volatile medium so that the data and computer programs is not lost when power is removed.

Conventional semiconductor memory devices store information in locations termed memory cells. Internally, data is organized in an array of sectors, each comprising a plurality of memory cells. Conventional semiconductor memory devices allow only a single bit of data to be written or erased at a given time. The typical memory cell comprises an access transistor and a storage element such as a capacitor. The data is represented in binary notation with a "1" or a "0", depending on the charge stored at the location. Such devices, however, require constant ambient power in order to retain the charge. Therefore, the data stored in such memory devices are susceptible to power loss.

Semiconductor memory devices that do not require ambient power to retain the data stored therein have been developed. These devices have been termed "non-volatile" semiconductor memory devices. In common designs for non-volatile semiconductor memory devices, data is erased in units of memory called sectors. and cannot be erased at the byte level. Each sector is partitioned into segments termed a page. Data is accessed for reading and programming by page, while the entire sector is accessed for erasing.

One-type of non-volatile memory device that can be used is termed Erasable Programmable Read Only Memory ("EPROM"). While conventional EPROM's provide reliable non-volatile storage, they may not be able to be reprogrammed in the field in a practical matter. For example, EPROM's typically require exposure to Ultraviolet light to erase. This often requires that the device be removed from its host to be erased. In many applications, removing the memory is not practical to reprogram. One type of EPROM is the Electrically Erasable Programmable Read Only Memory (EEPROM). An EEPROM is similar to an EPROM, but can be electrically reprogrammed with voltage pulses and without special hardware. An EEPROM has the disadvantages of being expensive and having a relatively limited life span, according to the number of erased and write operations.

Flash memory (or Flash RAM) is another form of non-volatile memory devices. Flash memory devices use a memory cell transistor with a floating gate structure. The typical memory cell in a flash memory device comprises an access transistor and a storage element, such as a floating gate. Data in the flash memory device are programmed or erased by accumulation or depletion of charge, respectively, on a thin insulating film between a substrate and a floating gate. Programming of the memory cells occurs by applying a sufficient voltage difference to the transistors to cause excess electrons to accumulate on the floating gate. The accumulation of the additional electrons on the floating gate raises the charge on the gate and the transistor's threshold voltage. The transistor's threshold voltage is raised sufficiently above that of the applied voltage during read cycles so that the transistor does not turn on during the read cycles. Therefore, a programmed memory cell will not carry current, representing the logical value "0." The erasure of a sector of data is caused by a process in which a voltage difference is applied to the transistor in each memory cell of the sector to cause the excess electrons on the floating gate in each transistor to evacuate the film. Thereby the transistor's threshold voltage is lowered below that of the voltage potential applied to the transistor to read data. In the erased state, current will flow through the transistor. When the read voltage potential is applied, the current will flow through the transistor of the memory cell, representing a logical value "1" stored in the memory cell.

Prior flash memory devices could be erased only by erasing the entire memory array. Selective erasure was not possible. To somewhat alleviate this problem, data stored in flash memory devices are organized into sectors where each sector contains a portion of the total bytes of data storage available. This arrangement allows the option of erasure of the memory device sector-by-sector. While typical flash memory devices are still incapable of byte by byte erasure, data may be programmed in the flash memory byte by byte. It will be appreciated that the granularity by which a flash memory device can be programmed or erased may vary and that granularities down to the bit level programming/erasure are contemplated.

In order to erase a flash memory, typically a complex process must be followed. At the present time, when multiple memory sectors need to be erased, they are erased in series. Each memory sector that needs to be erased is singly and sequentially until each memory sector so identified has been erased. For each sector an erasure cycle and a verify cycle is performed. During the erasure cycle, an erase voltage potential is applied to each memory cell in the selected memory sector to be erased. During the verify cycle, it is determined whether each memory cell in the selected sector is erased. When it is determined that the selected memory is not erased according to the verify cycle, the erase cycle on the selected memory sector is repeated. The erase and verify cycles are repeated until it is determined that each memory cell in the selected memory sector is erased according to the verify cycle. When it is determined that each memory cell in the selected memory sector is erased, one of the remaining plurality of memory sectors is selected and the erase and verify cycles performed on that memory sector. The erase and verify cycles are sequentially repeated on each of the memory sectors until each of the memory sectors is erased.

Because the erasure rate varies from sector to sector, the time necessary to erase each sector will also vary. Therefore, the erase cycle extends for a sufficient time to erase the memory cells in the memory sector and the verify cycle determines whether the erase was sufficient to erase all memory cells in the memory sector.

The erasure cycle of a sector of memory cells is comparatively slower than the verify cycles. During the erasure cycle, the voltage potential must be applied for sufficient time to allow the evacuation of electrons on the floating gate. For each memory sector, each erasure cycle will last approximately on the order of seconds, while each verify cycle lasts approximately on the order of milliseconds. Thus, the erasure is several thousands times longer than the verify cycle. Too frequent applications of the erasure voltage potential or application of the erasure voltage for extended periods of time may result in damage to the transistor.

Accordingly, there is a need in the art for a circuit and method that reduces the erase time of a semiconductor memory.

BRIEF SUMMARY OF THE INVENTION

By way of example only, a memory device comprises a plurality of memory sectors, each having a plurality of the memory cells that store data, and an erase-verify circuit, which erases memory sectors in parallel, by simultaneously erasing a plurality of memory sectors. The erase-verify circuit simultaneously erases a plurality memory sectors, and verifies that the memory cells in a selected memory sector of the plurality of memory sectors is erased. When it determines that the selected memory sector is not erased, it again erases the plurality of memory sectors and again verifies whether the selected memory sector is erased. The erasing of the plurality of memory sectors is repeated until it is verified that the memory cells in the selected memory sector is erased. When the erase-verify circuit verifies that the memory cells in the selected memory sector are erased, another of the remaining plurality of memory sectors not verified as erased is selected and it determines whether the selected memory sector is erased. If the erase-verify circuit verifies that that the selected memory sector is not erased, it erases the selected memory sector, and one of the remaining plurality of memory sectors, if there are more than two remaining memory sectors of the plurality that have not been verified as erased. When the erase-verify circuit determines that the selected memory sector is erased, another of the remaining plurality of memory sectors is selected and verified whether it is erased. The erase-verify circuit repeats the cycle of verifying and erasing as necessary until all of the plurality of memory sectors have been verified as erased. By simultaneously erasing multiple memory sectors, it is anticipated that that the number of erase cycles necessary to erase the plurality of memory sectors is reduced. By reducing the number of erase cycles, the overall time to erase the plurality of memory sectors is hereby reduced.

By way of example only, the method for reducing time for erasing in a memory device includes the process of identifying a group of memory sectors to be erased, simultaneously erasing multiple sectors of a memory device, verifying whether a selected memory sector is erased, iteratively identifying a subgroup of memory sectors or individual memory sectors to be erased, and repeating the erasure on the selected subgroup or individual memory sectors until all memory sectors of the group of memory sectors identified to be erased have been verified as being erased.

The foregoing discussion of the summary of the invention has been provided only by way of introduction. Nothing in this section should be taken as a limitation on the claims, which define the scope of the invention. Additional objects and advantages of the present invention will be set forth in the description that follows, and in part will be obvious from the description, or may be learned by practice of the present invention. The objects and advantages of the present invention may be realized and obtained by means of the instrumentalities and combinations particularly pointed out in the claims.

DETAILED DESCRIPTION OF THE PRESENTLY PREFERRED EMBODIMENTS

Hereinafter embodiments of the present invention will be explained with reference to accompanied figures.

The illustrated embodiments provide a non-volatile semiconductor memory device with reduced time for erasing the memory cells therein and a method thereof. The time to erase a nonvolatile semiconductor memory device is reduced according to simultaneously erasing a plurality of memory sectors, verifying that the memory cells in one of the plurality of memory sectors are erased, and iteratively verifying and erasing the remaining of the plurality of memory sectors until the all memory sectors identified to be erased have been verified as erased.

The preferred embodiments of the present invention will hereinafter be explained with reference to FIGS. 1 through 7.

Figure 1:
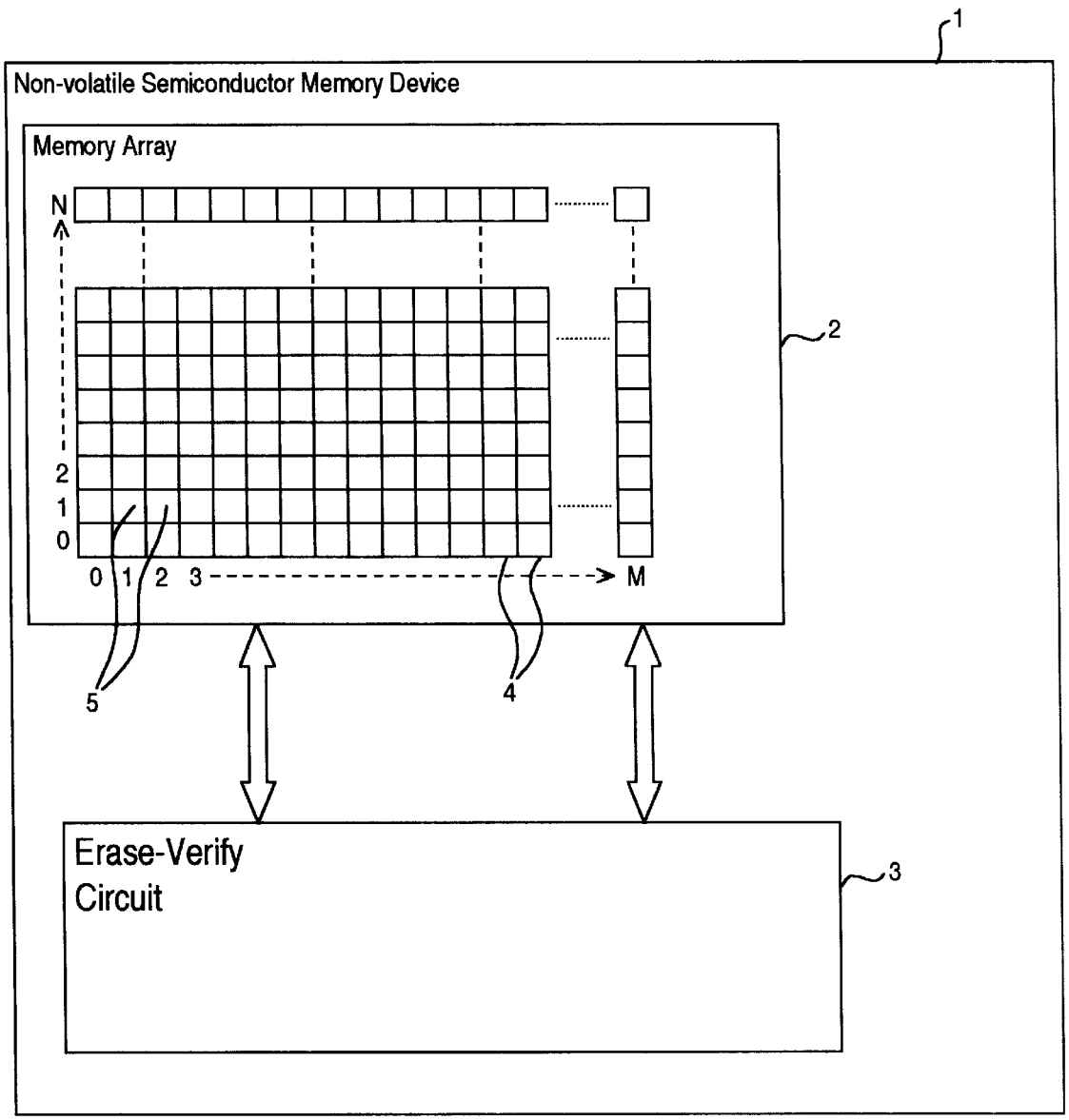
FIG. 1 is a block diagram showing the general arrangement of a non-volatile semiconductor memory device.
Figure 2:
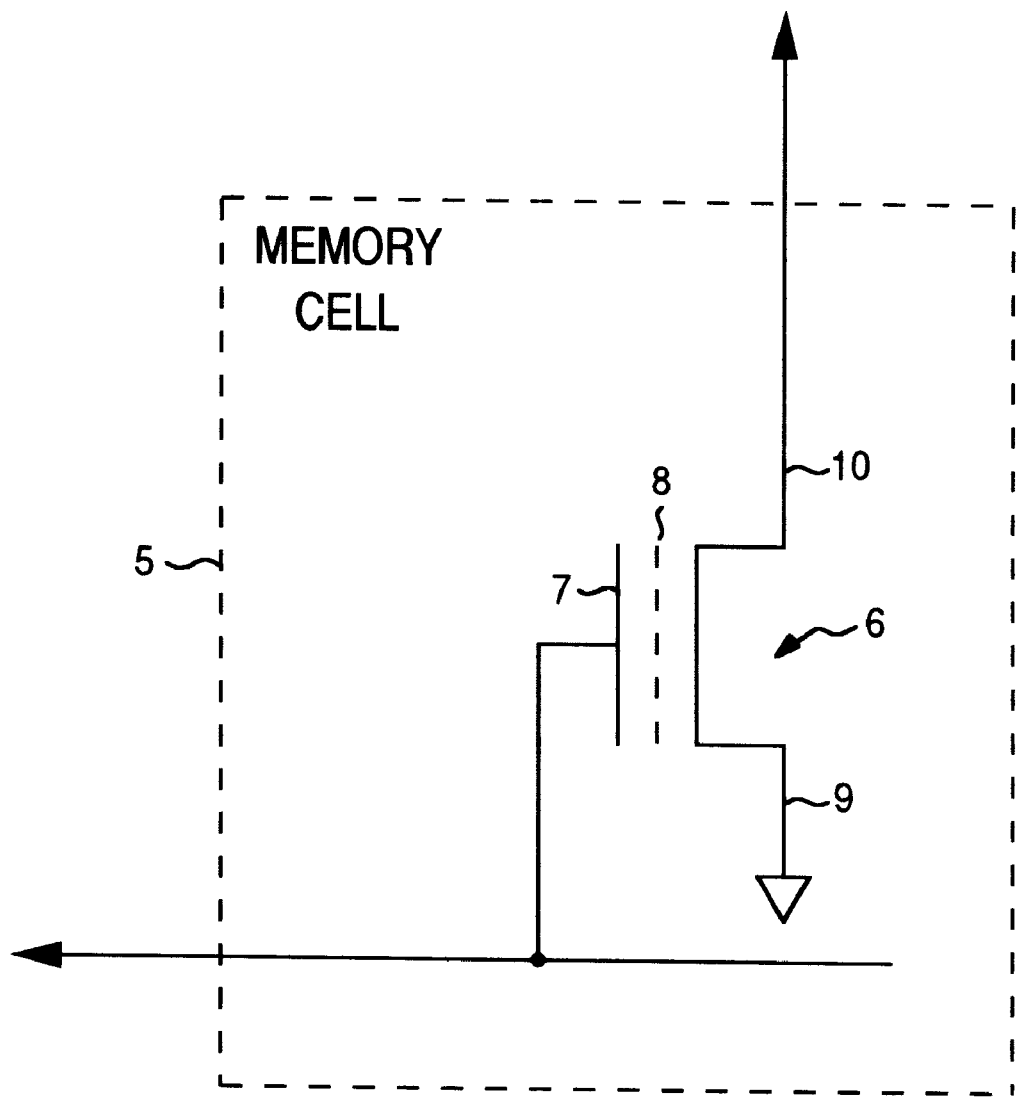
FIG. 2 is a schematic diagram that illustrates a memory cell.
Figure 3:
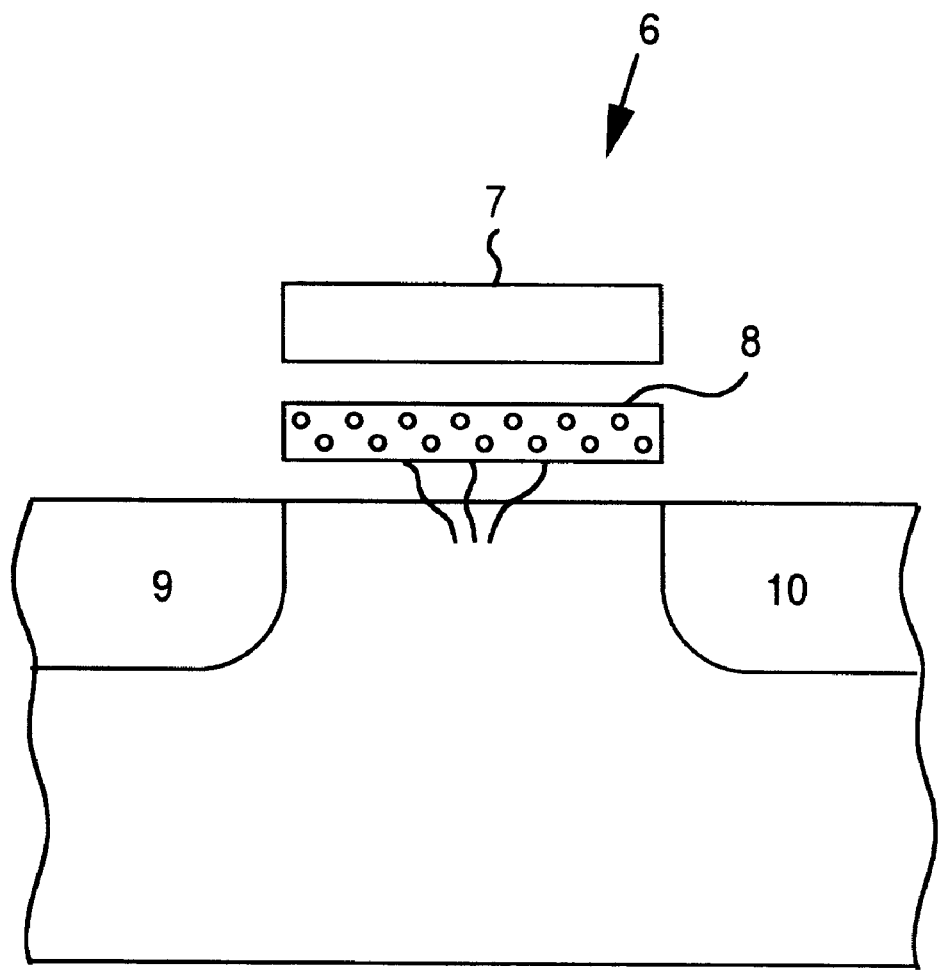
FIG. 3 is a cross-section view of a memory transistor with a floating gate.

Referring to FIG. 1–3, non-volatile semiconductor memory devices 1, often referred to as "flash memory," are known in the art. The non-volatile semiconductor memory device 1 of the present invention comprises a memory array 2 and an erase-verify circuit 3. Data stored in the memory array are organized into a plurality of M memory sectors 4. Each sector is divided in N pieces of memory cells 5 for storing bits of data. Each sector may include additional circuitry, such as a address decoding circuitry. In non-volatile semiconductor memory devices, the erase-verify circuit 3 is coupled to the memory array 2 so as to electrically erase the memory sectors 4. Those skilled in the art will recognize that each memory cell includes at least a memory transistor 6 with a variable threshold voltage $V_t$ for storing data. Data is electrically stored in a memory cell 5 by varying the threshold voltage $V_t$ of the memory transistor 6 in the memory cell 5. The memory transistor comprises a gate 7, a floating gate 8, a source 9, and drain 10. The threshold voltage $V_t$ of the memory transistor 6 can be increased by applying program voltage potential $V_p$ between the gate 7 and the drain 10 to cause electrons to gather at the floating gate 8. The threshold voltage $V_t$ of the memory transistor 6 can be decreased by applying an erase voltage potential, $V_e$. The voltage potential $V_e$ is of sufficient voltage of opposite polarity of that applied to increase the transistor threshold voltage $V_t$, between the gate 7 and the source 9 to cause electrons to evacuate the floating gate 8. When electrons are evacuated from the floating gate 8, the threshold voltage $V_t$ of the memory transistor 6 is erased. On the other hand, when electrons gather onto the floating gate 8 of the memory transistor 6, the threshold voltage $V_t$ of the memory transistor 6 increases so that the memory transistor 6 maintains the off state. To erase the memory cells 5, the threshold voltage $V_t$ of the memory transistor 6 in the memory cell 5 is set in a threshold voltage region less than the voltage potential applied to the memory cell to read data from the transistor $V_r$.

Referring to FIG. 1, the non-volatile semiconductor memory device 1 according to the present invention includes a plurality of non-volatile memory sectors 4 that can be simultaneously erased, and an erase-verify circuit 3 capable of simultaneously erasing multiple memory sectors 4. Each memory sector 4 is divided into a plurality of memory cells 5, capable of electrically storing data. The plurality of memory sectors combined is referred to as the memory array 2. Each memory cell comprises a memory transistor 6 capable of electrically storing data. The erase-verify circuit 3 is coupled to the memory sectors 4 to effectuate the erasing of the data stored therein.

Figure 4:
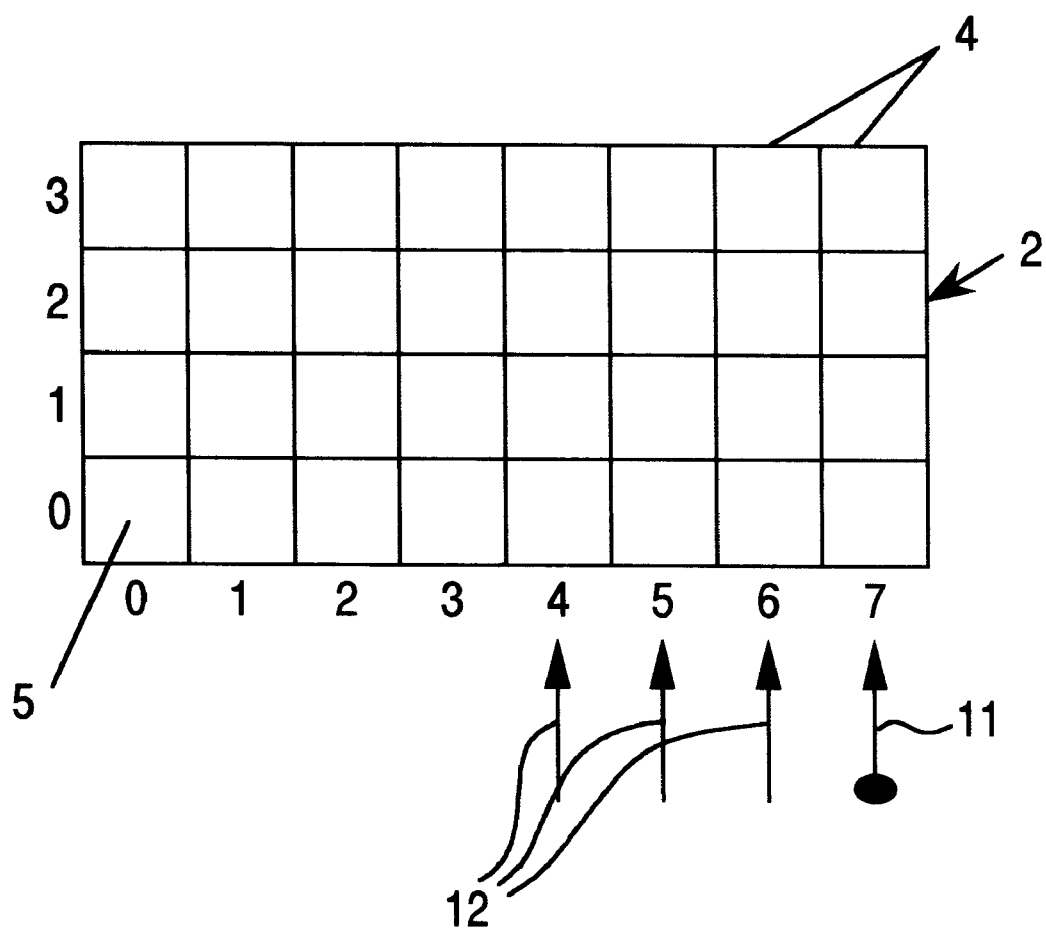
FIG. 4 is a diagram showing an erase-verify operation of a first period.

In a first period, FIG. 4, the erase-verify circuit 3 verifies that at least the memory cells 5 in the first selected memory sector 11 are erased. The erase-verify circuit 3 simultaneously erases the memory cells in each of a first selected memory sector 11 and first additional memory sectors 12 if it is verified that at least one of the memory cells 5 in said first selected memory 11 sector is not erased. To erase the memory cells 5, an erase voltage potential $V_e$ is simultaneously applied to the memory cells 5 in the first selected memory sector 11 and the first additional memory sectors 12. The erase voltage potential $V_e$ is applied to the memory cells 5 in each of the sectors 11 and 12 for a time substantially sufficient to reduce the threshold voltage $V_t$ of the memory transistor 6 in each memory cell 5 of the first selected memory sector 11 to a voltage region below the read voltage potential $V_r$. The erase-verify circuit 3 verifies whether the threshold voltage $V_t$ of the memory transistor 6 in each memory cell 5 in the first selected memory sector 11 is reduced to the voltage region.

Those skilled in the art will recognize that it is insignificant whether the eraseverify circuit 3 erases the memory cells 5 in the first selected memory sector 11 before or after it or verifies whether the memory cells 5 in the first selected memory sector 11 are erased. The first selected memory sector 11 and first additional memory sectors 12 can be chosen from any memory sector 4 of the memory array 2. It is preferred that the first selected memory sector 11 is the highest number sector to be erased (Memory Sector M) and the first additional sectors 12 are the next adjacent memory sectors to the first selected memory sector 11. It is more preferable that the first additional memory sectors 12 comprise the next three adjacent memory sectors to the first selected memory sector 11. In the embodiment of FIG. 4, four adjacent memory sectors are chosen, but any suitable number and combination of memory sectors 4 may be selected.

Figure 5:
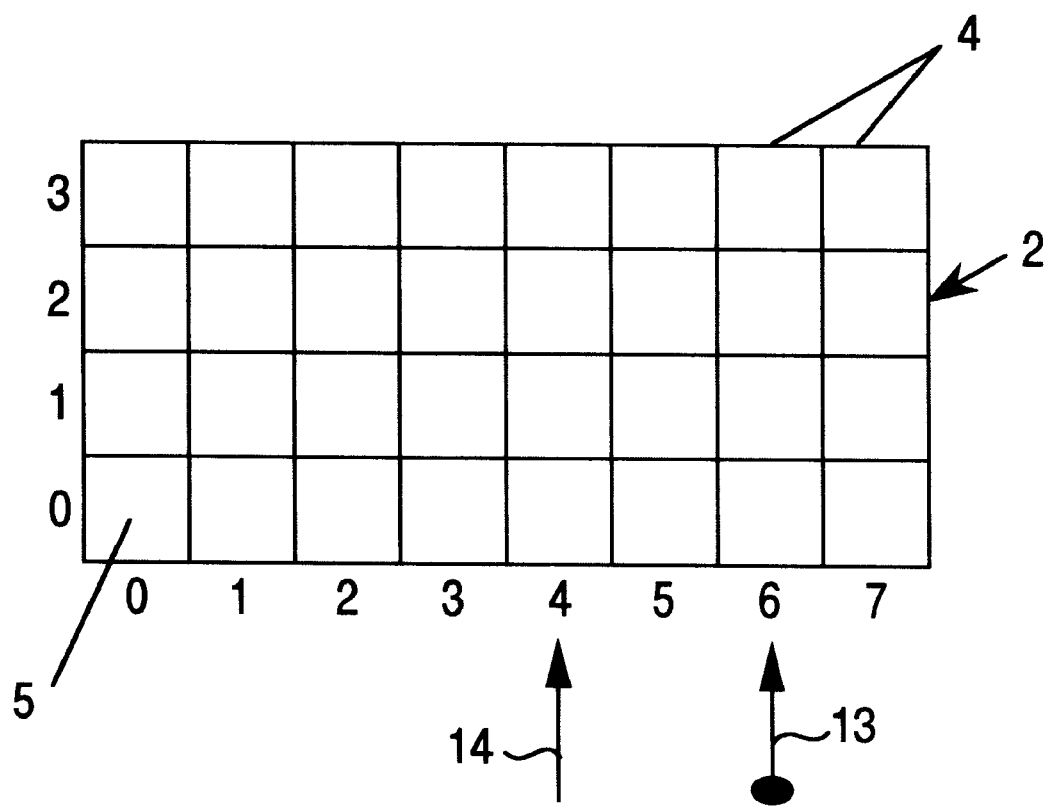
FIG. 5 is a diagram showing an erase-verify operation of a second period.
Figure 6:
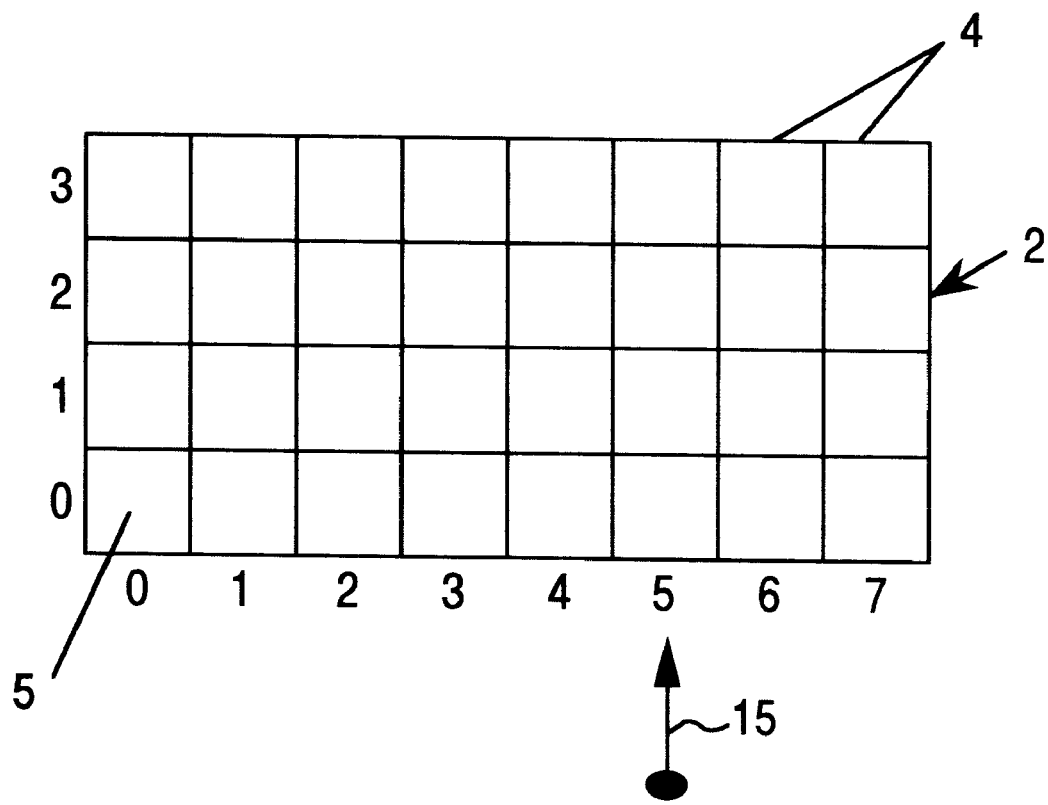
FIG. 6 is a diagram showing an erase-verify operation of a third period.

In a second period, FIG. 5, the erase-verify circuit 3 verifies that the memory cells 5 in at least the second selected memory sector 13 are erased. The erase-verify circuit simultaneously erases the memory cells 5 in each of a second selected memory sector 13 and a second additional memory sector 14 if it is verified that at least one of the memory cells 5 in said second selected memory sector 13 is not erased. To erase the memory cells 5, an erase voltage potential $V_e$ is applied to the memory cells in each of the second selected memory sector 13 and the second additional memory sector 14. The erase voltage potential $V_e$ is applied to the memory cells 5 in each of the sectors for a time substantially sufficient to reduce the threshold voltage $V_t$ of the memory transistor 6 in each memory cell 5 in the second selected memory sector 13 to a voltage region below the read voltage potential $V_r$. The erase-verify circuit 3 verifies whether the threshold voltage $V_t$ of the memory transistor 6 in each memory cell 5 in the second selected memory sector 13 is reduced to the voltage region.

It is preferred that said second period sequentially follows said first period in time. Those skilled in the art will recognize that it is likely that the second period is of shorter duration than the first period. In the second period, it is preferred that the second selected memory sector 13 and said second additional memory sector 14 are selected from said first additional memory sectors. It is more preferred that the second selected memory sector 13 is the memory sector of the first additional memory sectors 12 adjacent to the first selected memory sector 11 and the second additional memory sector is lowest number memory sector of the first additional memory sectors 12.

Figure 7:
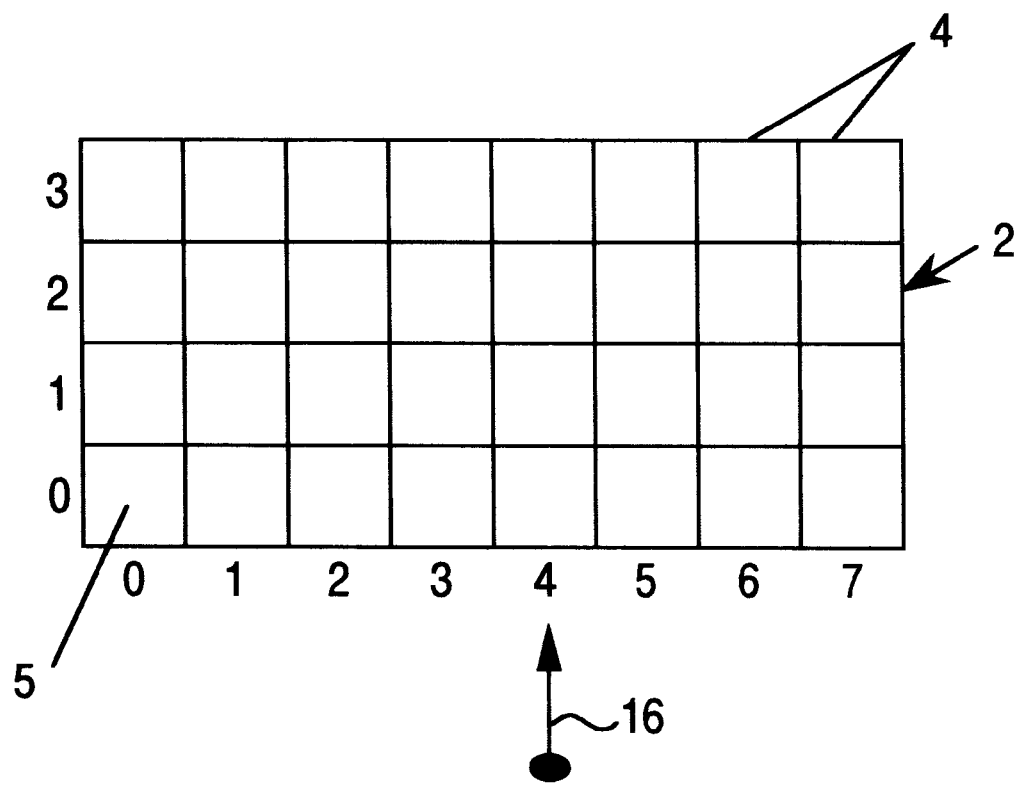
FIG. 7 is a diagram showing an erase-verify operation of a fourth period.
Figure 8:
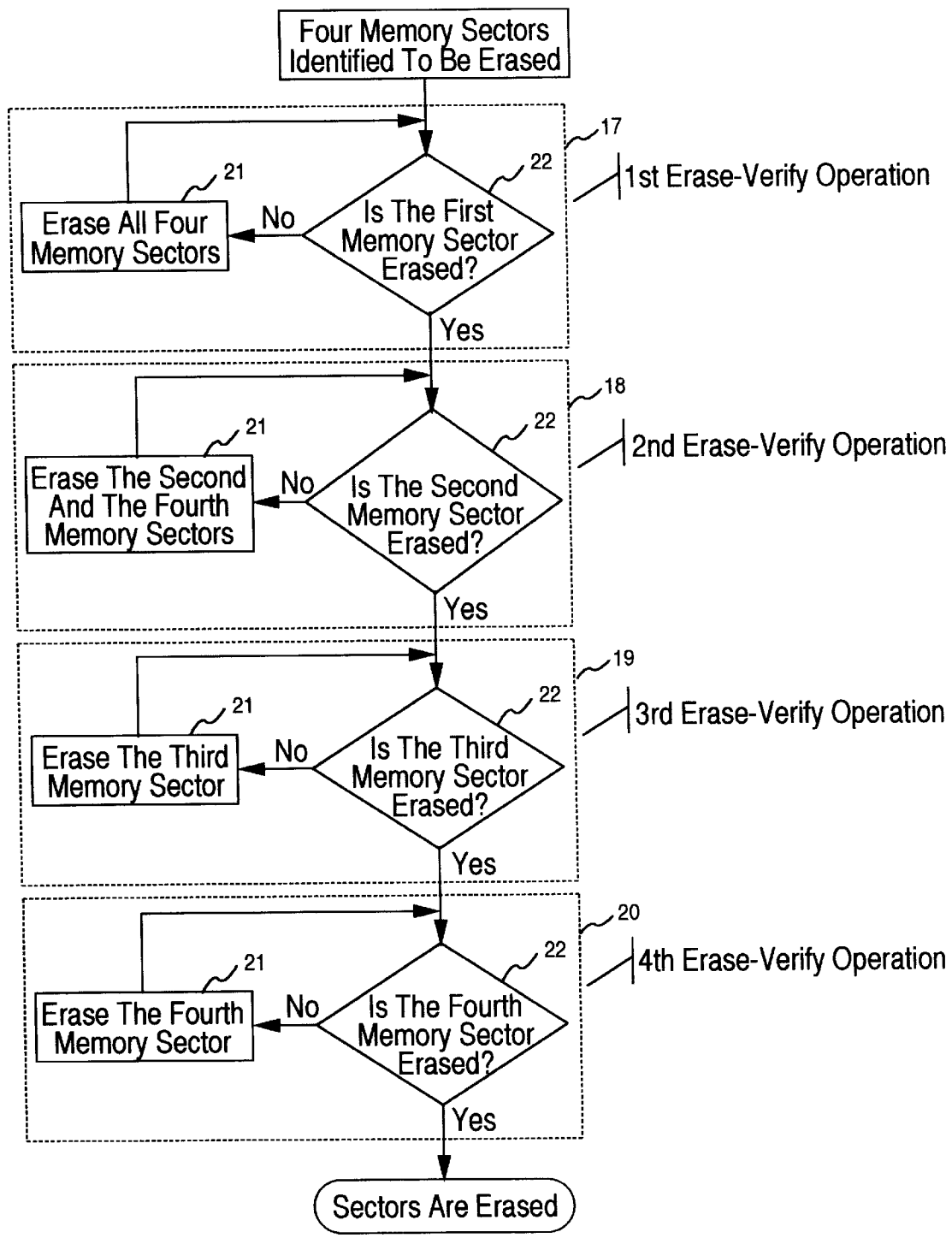
FIG. 8 is a flow chart showing the sequence for reducing time to erase a non-volatile semiconductor memory device of the present invention.

In a third period, FIG. 7, the erase-verify circuit 3 verifies that the memory cells in the third selected memory sector 15 are erased. The erase-verify circuit 3 erases the memory cells 5 in the third selected memory sector 15 if it is verified that at least one of the memory cells in said third selected memory 15 sector is not erased according to the verify operation. To erase the memory cells 5, an erase voltage potential $V_e$ is applied to the memory cells in the third selected memory sector 15 for a time substantially sufficient to reduce the threshold voltage $V_t$ of the memory transistor 6 in each memory cell 5 in the third selected memory sector 15 to a voltage region below the read voltage potential $V_r$. The erase-verify circuit 3 verifies whether the threshold voltage $V_t$ of the memory transistor 6 in each memory cell 5 in the first selected memory sector 15 is so reduced.

It is preferred that said third period sequentially follows said second period in time. Those skilled in the art will recognize that it is likely that the third period is of shorter duration than the second first period. In the third period, it is preferred that the third selected memory sector 15 is selected from memory sectors including the first additional memory sectors 12 and excluding the second selected memory sector 13. It is more preferred that the third selected memory sector 15 is the memory sector of the first additional memory sectors 12 adjacent to the second selected memory sector 13 and next adjacent to the first selected memory sector 11.

In a fourth period, FIG. 7, the erase-verify circuit 3 erases a fourth selected memory sector 16 and verifies that the memory cells 5 in the fourth selected memory sector 16 are erased. The erase-verify circuit 3 erases the memory cells 5 in the fourth selected memory sector 16 if it is verified that at least one of the memory cells in said fourth selected memory 16 sector is not erased. To erase the memory cells 5, an erase voltage potential $V_e$ is applied to the memory cells in the fourth selected memory sector 16 for a time substantially sufficient to reduce the threshold voltage $V_t$ of the memory transistor 6 in each memory cell 5 in the fourth selected memory sector 16 to a voltage region below the read voltage potential $V_r$. The erase-verify circuit 3 verifies whether the threshold voltage $V_t$ of the memory transistor 6 in each memory cell 5 in the fourth selected memory sector 16 is so reduced.

It is preferred that said fourth period sequentially follows said third period in time. Those skilled in the art will recognize that it is likely that the fourth period is of shorter duration than the third period. In the fourth period, it is preferred that the fourth selected memory sector 16 is selected from memory sectors including the first additional memory sectors 12 and excluding the second selected memory sector 13 and third additional memory sector 15. It is more preferred that the fourth selected memory sector 16 is one of the memory sectors of the first additional memory sectors 12 adjacent to the third selected memory sector 15 and next adjacent to the second selected memory sector 13.

Those skilled in the art will recognize that erase-verify circuit 3 can verify that the memory array 2 is erased by iteratively repeating the above-described procedure for further selected memory sectors until all memory sectors 4 in the memory array 2 are verified erased.

A method for erasing the non-volatile semiconductor memory device will hereinafter be explained with reference to FIGS. 5, 6, 7, and 8.

The method for erasing a non-volatile semiconductor memory device 1 according to a first embodiment of the present invention comprises a first erase-verify operation 17, a second erase-verify operation 18, a third erase-verify operation 19 and a fourth erase-verify operation 20. Each of the first erase-verify operation 17, second erase-verify operation 18, third erase-verify operation 19, and fourth erase-verify operation 20 comprise an erase cycle 21 and a verify cycle 22. The erase cycle 21 is performed for a period of time common to the non-volatile semiconductor device 1 for erasing the memory sectors 4 therein. The verify cycle 22 is carried out to determine whether all the memory cells 5 in a selected memory sector are erased. When a memory cell 4 in the selected sector is not erased according to the verify cycle 22, the erase cycle 21 is repeated. If the memory cells 5 are verified erased according to the verify operation 22, the next erase-verify operation is performed.

In the first erase-verify operation 17, the memory cells 5 in the first selected memory sector 11 are verified erased. The first erase-verify operation comprises an erase cycle 21 and a verify cycle 22. In the erase cycle 21, the memory cells 5 in the first selected memory sector 11 and the first additional memory sectors 12 are simultaneously erased. In the verify cycle 22, it is verified whether the memory cells 5 in the first selected memory sector 11 are erased. The memory cells 5 in first selected memory sector 11 and said first additional memory sectors 12 are simultaneously erased if it is verified that at least one of the memory cells 5 in the first selected memory 11 sector is not erased, according to the verify cycle.. Those skilled in the art will recognize that it is insignificant whether the erase cycle 21 occurs before or after it or the verify cycle 22.

It is preferred that the first selected memory sector 11 is the highest number sector to be erased (Memory Sector M) and the first additional sectors 12 are the next adjacent memory sectors to the first selected memory sector 11. It is more preferable that the first additional memory sectors 12 comprise the next three adjacent memory sectors to the first selected memory sector 11.

In the second the erase-verify operation 18, the memory cells 5 in the second selected memory sector 13 are verified erased. The second erase-verify operation 18 comprises an erase cycle 21 and a verify cycle 22. In the erase cycle 21, the memory cells 5 in the second selected memory sector 13 and the second additional memory sector 14 are simultaneously erased. In the verify cycle 22, it is verified whether the memory cells 5 in the second selected memory sector 13 are erased. The memory cells in the second selected memory sector 13 and the second additional memory sector 14 are erased if it is verified that at least one of the memory cells 5 in the second selected memory sector 13 is not erased, according to the verify cycle.

It is preferred that second erase-verify operation 18 sequentially follows said first erase-verify operation 17 in time and that the second erase-verify 18 operation is of shorter duration than the first erase-verify operation 17. It is preferred that the second selected memory sector 13 and said second additional memory sector 14 are selected from said first additional memory sectors. It is more preferred that the second selected memory sector 13 is the memory sector of the first additional memory sectors 12 adjacent to the first selected memory sector 11 and the second additional memory sector is lowest number memory sector of the first additional memory sectors 12.

In the third erase-verify operation 19, the memory cells 5 in the third selected memory sector 15 are verified erased. The third erase-verify operation 19 comprises an erase cycle 21 and a verify cycle 22. In the erase cycle 21, the memory cells 5 in the third selected memory sector 15 are erased. In the verify cycle 22, it is verified whether the memory cells 5 in the third selected memory sector 15 are erased. The memory cells 5 in the third selected memory sector 15 are erased if it is determined that at least one of the memory cells 5 in the third selected memory 15 sector is not erased, according to the verify cycle 22.

It is preferred that said third erase-verify operation 19 sequentially follows said second erase-verify operation 18 in time and that the third erase-verify 19 operation is of shorter duration than the second erase-verify operation 18. In the third erase-verify operation, it is preferred that the third selected memory sector 15 is selected from memory sectors including the first additional memory sectors 12 and excluding the second selected memory sector 13. It is more preferred that the third selected memory sector 15 is the memory sector of the first additional memory sectors 12 adjacent to the second selected memory sector 13 and next adjacent to the first selected memory sector 11.

In the fourth erase-verify operation 20, the memory cells in the fourth selected memory sector 16 are verified erased. The fourth erase-verify operation 18 comprises an erase cycle 21 and a verify cycle 22. In the erase cycle 21, the memory cells 5 in the fourth selected memory sector 16 are erased. In the verify cycle 22, it is verified whether the memory cells 5 in the fourth selected memory sector 16 are erased. The memory cells 5 in the fourth selected memory sector 16 are erased if it is determined that at least one of the memory cells 5 in the fourth selected memory 16 sector is not erased, according to the verify cycle 22.

It is preferred that said fourth erase-verify operation 20 sequentially follows said third erase-verify operation 19 in time and that the fourth erase-verify 20 operation is of shorter duration than the third erase-verify operation 19. It is preferred that the fourth selected memory sector 16 is selected from memory sectors including the first additional memory sectors 12 and excluding the second selected memory sector 13 and third selected memory sector 15. It is more preferred that the fourth selected memory sector 16 is one of the memory sectors 4 of the first additional memory sectors 12 adjacent to the third selected memory sector 15 and next adjacent to the second selected memory sector 13.

Those skilled in the art will recognize that the above-described erase-verify operations can be repeated on further selected memory sectors 4 until all memory sectors 4 in the memory array 2 are verified erased.

As heretofore mentioned, according to the present invention, a non-volatile semiconductor memory device capable of reducing the time for erasing according to the number of erase-verify operations, wherein multiple memory sectors are simultaneously erased and an erase method thereof can be obtained.

While particular embodiments of the present invention have been shown and described, modifications may be made. It is therefore intended in the appended claims to cover all such changes and modifications that fall within the true spirit and scope of the invention.

What is claimed is:

1. A method for erasing a flash memory device, said flash memory device comprising at least a first selected memory sector, a second selected memory sector, a third selected memory sector, and a fourth selected memory sector, each selected memory sector including a plurality of memory cells, the method comprising:
    a first erase-verify operation wherein the first selected memory sector, second selected memory sector, third selected memory sector, and fourth selected memory sector are simultaneously erased if it is verified that at least one memory cell in the first selected memory sector is not erased;
    a second erase-verify operation wherein the second and fourth selected memory sectors are simultaneously erased if it is verified that at least one memory cell in the second selected memory sector is not erased;
    a third erase-verify operation wherein the third selected memory sector is erased if it is verified that at least one memory cell in the third selected memory sector is not erased;
    a fourth erase-verify operation wherein the fourth selected memory sector is erased if it is verified that at least one memory cell in the second selected memory sector is not erased.

2. A non-volatile semiconductor memory device, comprising:
    a plurality of memory sectors each including a plurality of memory cells that store data;
    an erase-verify circuit capable of (i) erasing the memory cells in a first selected memory sector and first additional memory sectors, and (ii) verifying that the memory cells in the first selected memory sector are erased in a first period.

3. The non-volatile semiconductor memory device according to claim 2, wherein said erase-verify circuit erases the memory cells in the first selected memory sector and said first additional memory sectors when at least one of the memory cells in said first selected memory sector is verified not erased.

4. The non-volatile semiconductor memory device according to claim 3, wherein said first additional memory sectors comprise at least three memory sectors.

5. The non-volatile semiconductor memory device according to claim 2, wherein said erase-verify circuit is capable of (i) erasing the memory cells in a second selected memory sector and a second additional memory sector, and (ii) verifying that the memory cells in the second selected memory sector are erased in a second period.

6. The non-volatile semiconductor memory device according to claim 5, wherein said erase-verify circuit erases the memory cells in the second selected memory sector and said second additional memory sector when at least one of the memory cells in said second selected memory sector is verified not erased.

7. The non-volatile semiconductor memory device according to claim 6, wherein said second selected memory sector and said second additional memory sector are selected from said first additional memory sectors.

8. The non-volatile semiconductor memory device according to claim 7, wherein said second period sequentially follows said first period in time and is of shorter duration than the first period.

9. The non-volatile semiconductor memory device according to claim 5, wherein said erase-verify circuit is capable of (i) erasing the memory cells in a third selected memory sector, and (ii) verifying that the memory cells in the third selected memory sector are erased in a third period.

10. The non-volatile semiconductor memory device according to claim 9, wherein said erase-verify circuit erases the memory cells in the third selected memory sector when at least one of the memory cells in said third selected memory sector is verified not erased.

11. The non-volatile semiconductor memory device according to claim 10, wherein said third selected memory sector is selected from memory sectors including the first additional memory sectors and excluding the second selected memory sector.

12. The non-volatile semiconductor memory device according to claim 11, wherein said third period sequentially follows said second period in time and is of shorter duration than the second period.

13. The non-volatile semiconductor memory device according to claim 9, wherein said erase-verify circuit is capable of (i) erasing the memory cells in a fourth selected memory sector, and (ii) verifying that the memory cells in the fourth selected memory sector are erased in a fourth period.

14. The non-volatile semiconductor memory device according to claim 13, wherein said erase-verify circuit erases in the memory cells in the fourth selected memory sector when at least one of the memory cells in said fourth selected memory sector is verified not erased.

15. The non-volatile semiconductor memory device according to claim 14, wherein the fourth selected memory sector is selected from memory sectors including the first additional memory sectors and excluding the second and third selected memory sectors.

16. The non-volatile semiconductor memory device according to claim 15, wherein said fourth period sequentially follows said third period in time and is of shorter duration than the third period.

17. The non-volatile semiconductor memory device according to claim 16, wherein each of the plurality of memory cells comprises a memory transistor with a variable threshold voltage, each of the plurality of memory cells storing data based on variances in threshold voltage.

18. The non-volatile semiconductor memory device according to claim 17, wherein the erase-verify circuit is capable of setting the threshold voltage of the memory transistors in the threshold voltage region and verifying whether the threshold voltage of the memory transistors are set within the threshold voltage region.

19. The non-volatile semiconductor memory device according to claim 18, wherein said threshold voltage region is less than the voltage potential applied to the memory transistor to read data.

20. The non-volatile semiconductor memory device according to claim 19, wherein said memory device is a flash memory.

21. A non-volatile semiconductor memory device, comprising:

at least a first selected memory sector, a second selected memory sector, a third selected memory sector, and a fourth selected memory sector, each said memory sector including a plurality of memory cells;

an erase-verify circuit capable of erasing the first selected memory sector and a plurality of additional memory sectors and verifying that at least the first selected memory sector is erased in a first period; erasing the second selected memory sector and an additional memory sector and verifying that at least the second selected memory sector is erased in a second period, erasing the third selected memory sector and verifying that the third selected memory sector is erased in a third period, and erasing the fourth selected memory sector and verifying that the fourth selected memory sector is erased in a fourth period.

22. The non-volatile semiconductor memory device according to claim 21, wherein the erase-verify circuit erases the first selected memory sector and plurality of additional memory sectors in the first period if it is verified that at least one memory cell in the first selected memory sector is not erased; erases the second selected memory sector and additional memory sector in the second period if it is verified that at least one of the memory cells in the second selected memory sector is not erased; erases the third selected memory sector in the third period if it is verified that at least one memory cell in the third selected memory sector is not erased; erases the fourth selected memory sector in the third period if it is verified that at least one of the memory cell in the fourth selected memory sector is not erased.

23. The non-volatile semiconductor memory device according to claim 22, wherein the first period, second period, third period, and fourth period occur sequentially in time.

24. The non-volatile semiconductor memory device according to claim 23, wherein the second period is shorter duration than the first period, the third period is shorter duration than the second period, and the fourth period is of shorter duration than the third period.

25. The non-volatile semiconductor memory device according to claim 24, wherein the memory device is a flash memory device.

26. A method for erasing a non-volatile semiconductor memory device comprising a plurality of memory sectors, each said memory sector including. a plurality of memory cells, said method comprising:

a first erase-verify operation, whereby memory cells in a first selected memory sector and first additional memory sectors are erased if it is verified that at least one memory cell of the first selected memory sector is not erased; and a second erase-verify operation whereby memory cells in a second selected memory sector and a second additional memory sector are erased if it is determined that at least one memory cell in the second selected memory sector is not erased, wherein said second selected memory sector and second additional memory sectors are selected from said first additional memory sectors.

27. The method for erasing a non-volatile semiconductor memory device according to claim 26, further comprising:

a third erase-verify operation whereby memory cells in a third selected memory sector are erased when it is determined that at least one memory cell in the third selected memory sector is not erased, wherein said third selected memory sector is selected from memory sectors including the first additional memory sectors and excluding the second selected memory sector.

28. The method for erasing a non-volatile semiconductor memory device according to claim 27, further comprising:

a fourth erase-verify operation whereby memory cells in a fourth selected memory sector are erased if it is determined that at least one memory cell in the fourth selected memory sector is not erased, wherein said fourth selected memory sector is selected from memory sectors including the first additional memory sectors, and excluding the second selected memory sector and the third selected memory sector.

29. The method for erasing a non-volatile semiconductor memory device according to claim 28, wherein the first additional memory sectors comprises at least three memory sectors.

30. The method for erasing a non-volatile semiconductor memory device according to claim 29, wherein the second erase-verify operation follows the first erase-verify operation, the third erase-verify operation follows the second erase-verify operation, and the fourth erase-verify operation follows the third erase-verify operation.

31. The non-volatile semiconductor memory device according to claim 30, wherein the second erase-verify operation is of shorter duration than the first erase-verify operation, the third erase-verify operation is of shorter duration than the second erase-verify operation, and the fourth erase-verify operation is of shorter duration than the third erase-verify operation.

32. The method for erasing a non-volatile semiconductor memory device according to claim 31, wherein the memory device is a flash memory.

33. A method for erasing a non-volatile semiconductor memory device comprising a plurality of memory sectors, each memory sector comprising a plurality of memory cells, said method comprising:

a first erase-verify operation, wherein a first selected memory sector and a plurality of additional memory sectors are erased if it is verified that at least one of the memory cells of the first selected memory sector is not erased;

a second erase-verify operation, wherein a second selected memory sector and an additional memory sector are erased if it is determined that at least one of the memory cells of the second selected memory sector is not erased, said second selected memory sector and additional memory sector are selected from said plurality of additional memory sectors;

a third erase-verify operation, wherein a third selected memory sector is erased if it is determined that at least one of the memory cells of the third selected memory sector is not erased, said third selected memory sector selected from memory sectors including the plurality of additional memory sectors and excluding the second selected memory sector; and a fourth erase-verify operation, wherein a fourth selected memory sector is erased if it is determined that at least one of the memory cells of the fourth selected memory sector is not erased, said fourth selected memory sector being selected from memory sectors including the plurality of additional memory sectors and excluding the second selected memory sector and third selected memory sectors.

34. The method for erasing a non-volatile semiconductor memory device according to claim 33, wherein each memory cell in said plurality of memory sectors comprises at least one memory transistor with a variable threshold voltage storing data based on variances in threshold voltage.

35. The method for erasing a non-volatile semiconductor memory device according to claim 34, wherein the threshold voltage of the transistor in each memory cell are set to a threshold voltage region less than the voltage applied to the transistor to read data.

36. The method for erasing a non-volatile semiconductor memory device according to claim 35, wherein the first erase-verify operation, second erase-verify operation, third erase-verify operation, and fourth erase-verify operation occur sequentially in time.

37. The method for erasing a non-volatile semiconductor memory device according to claim 36, wherein the memory device is a flash memory.

* * * * *